(12) United States Patent  
Hollis

(10) Patent No.: US 9,300,297 B2
(45) Date of Patent: Mar. 29, 2016

(54) REFERENCE-VOLTAGE-LESS PSEUDO-DIFFERENTIAL INPUT CIRCUITRY

(71) Applicant: QUALCOMM Incorporated, San Diego, CA (US)

(72) Inventor: Timothy Mowry Hollis, Poway, CA (US)

(73) Assignee: QUALCOMM Incorporated, San Diego, CA (US)

( * ) Notice: Subject to any disclaimer, the term of this patent is extended or adjusted under 35 U.S.C. 154(b) by 200 days.

(21) Appl. No.: 14/072,431

(22) Filed: Nov. 5, 2013

(65) Prior Publication Data

US 2015/0123709 A1    May 7, 2015

(51) Int. Cl.
*H03K 19/00*     (2006.01)
*H03K 19/0185*   (2006.01)
*H03K 19/003*    (2006.01)

(52) U.S. Cl.
CPC .. *H03K 19/018521* (2013.01); *H03K 19/00315* (2013.01)

(58) Field of Classification Search
CPC ............... H03K 19/018521; H03K 19/00315; H03K 19/018507; H03K 19/018514; H03K 19/018528
See application file for complete search history.

(56) References Cited

U.S. PATENT DOCUMENTS

| 3,819,955 | A * | 6/1974 | Hilbert | ............................. 377/95 |
| 6,559,723 | B2 * | 5/2003 | Hollenbeck et al. | .......... 330/301 |
| 6,975,845 | B2 | 12/2005 | Vilhonen et al. | |
| 7,541,870 | B2 * | 6/2009 | Chang et al. | .................. 330/253 |
| 7,671,686 | B2 * | 3/2010 | Kuo et al. | ..................... 330/301 |
| 7,839,219 | B2 * | 11/2010 | Kuo et al. | ..................... 330/301 |
| 8,035,438 | B2 | 10/2011 | Esch, Jr. | |
| 8,253,437 | B2 | 8/2012 | Garg et al. | |
| 8,385,877 | B2 * | 2/2013 | Chang et al. | .................. 455/341 |
| 8,461,896 | B2 | 6/2013 | Zhuang | |
| 2004/0008091 | A1 * | 1/2004 | Ramet | ............................. 331/74 |
| 2010/0013537 | A1 | 1/2010 | Eminoglu et al. | |
| 2011/0234379 | A1 | 9/2011 | Lee | |

FOREIGN PATENT DOCUMENTS

DE     102011087124 A1    5/2012

OTHER PUBLICATIONS

International Search Report and Written Opinion—PCT/US2014/063502—ISA/EPO—Jan. 28, 2015.

* cited by examiner

*Primary Examiner* — Jung Kim
(74) *Attorney, Agent, or Firm* — Loza & Loza, LLP

(57) ABSTRACT

System, methods and apparatus are described that facilitate data communications using a single-ended communication link. A method for data communications includes decoupling a direct current component from an alternating current component of a single-ended input signal, biasing the alternating current component with a predetermined bias voltage to obtain a realigned signal, and providing a digital output representative of the input signal by comparing the realigned signal with the predetermined bias voltage. The realigned signal can be compared with the predetermined bias voltage using hysteresis comparison to provide an output signal that switches between logic states compatible with a logic circuit.

35 Claims, 9 Drawing Sheets

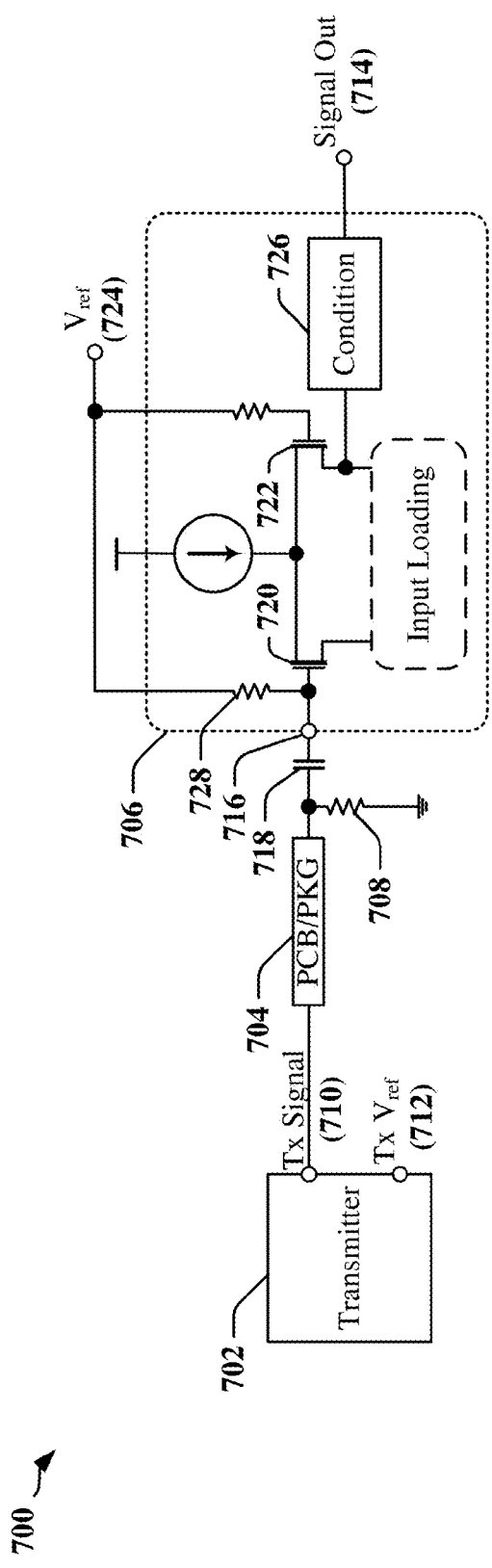
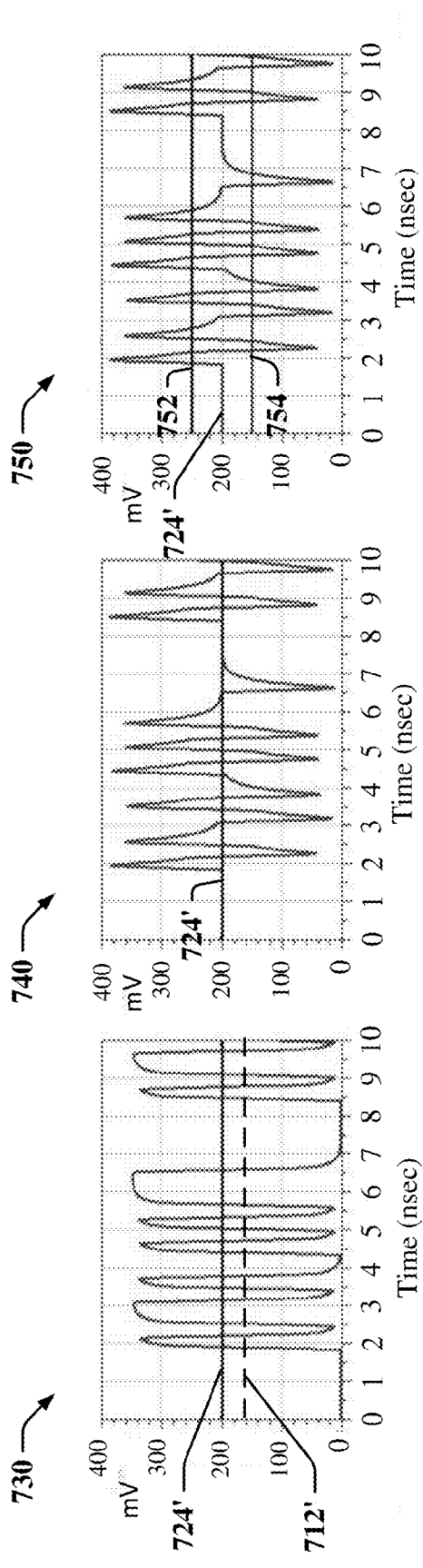
FIG. 7

REFERENCE-VOLTAGE-LESS PSEUDO-DIFFERENTIAL INPUT CIRCUITRY

BACKGROUND

1. Field

The present disclosure relates generally to high-speed data communications interfaces, and more particularly, to single-ended high-speed data communication links.

2. Background

Manufacturers of mobile devices, such as cellular phones, may deploy various electronic components in one or more integrated circuit (IC) devices and/or on one or more circuit boards. The electronic components may include processing devices, storage devices, communications transceivers, display drivers, and the like. In one example, a processing device may be provided on a printed circuit board (PCB) and may communicate with one or more memory devices on the same PCB and/or on a different PCB. The processor may communicate with the memory devices using a high-speed communication link that supports unidirectional and bidirectional channels for data and control signals.

In a multi-wire interface, the maximum speed of the communication link and the ability of a receiver to capture data may be limited by the maximum time variation related to transitions of signals transmitted on the communication link. In a multi-wire interface, transitions on different wires may exhibit different variations of signal transition times, which can cause the outputs of receivers in a receiving device to change at different times with respect to a data or symbol boundary. Large transition time differences in multi-wire signals can limit the throughput on the communication link by significantly restricting the period of the transmission clock.

SUMMARY

Embodiments disclosed herein provide systems, methods and apparatus that can provide improved performance over single-ended communication links. According to one or more aspects disclosed herein, time variations related to transitions of signals transmitted on the communication link may be reduced.

In an aspect of the disclosure, a method for data communications includes decoupling a direct current (DC) component of an input signal received from a single-ended data link from an alternating current (AC) component of the input signal, biasing the AC component with a predetermined bias voltage to obtain a realigned signal, and providing a digital output representative of the input signal by comparing the realigned signal with the bias voltage. Accordingly, decoupling the DC component from the AC component in the input signal received at a receiver from a transmitter may include or cause decoupling of the receiver from a reference voltage used by a transmitter that provides the input signal.

In an aspect of the disclosure, the realigned signal is compared with the bias voltage using hysteresis comparison that switches the digital output between logic states compatible with a logic circuit that receives the digital output. In one example, the digital output may switch between logic states that are compatible with complementary metal-oxide-semiconductor (CMOS) logic levels.

In an aspect of the disclosure, the DC component is decoupled from the AC component using a capacitor. Biasing the AC component may include resistively coupling an output of the capacitor to the bias voltage. The capacitor may have a capacitance selected to cause the realigned signal to return to the bias voltage level between transitions. In one example, the bias voltage may be a system ground. In another example, the bias voltage may be a center voltage between two power supply rails. The output of the capacitor may be resistively coupled to the bias voltage using a resistor having a value and otherwise configured to cause the realigned signal to return to the bias voltage between transitions. The AC component may emphasize transitions in the input signal. Biasing the AC component may include centering the AC component on a voltage level coincident with the optimal input common-mode level of the receiving circuitry.

In an aspect of the disclosure, the input signal is received from a transmission line. The transmission line may include one or more of a trace on a printed circuit board, package substrate, silicon (or alternative material) interposer, metallization on an integrated circuit, and a wire.

In an aspect of the disclosure, an apparatus for data communications includes means for decoupling a DC component of an input signal received from a single-ended data link from an AC component of the input signal, means for biasing the AC component with a bias voltage to obtain a realigned signal, and means for providing a digital output representative of the input signal. The means for providing a digital output may be configured to generate the digital output by comparing the realigned signal with the bias voltage.

In an aspect of the disclosure, a digital device for data communications may include a receiving circuit coupled to a single-ended transmission line, a decoupling circuit that is configured to decouple a DC component of an input signal received over the transmission line from an AC component of the input signal, a biasing circuit adapted to bias the AC component with a bias voltage to obtain a realigned signal, and comparison logic configured to generate a digital output representative of the input signal by comparing the realigned signal with the bias voltage.

BRIEF DESCRIPTION OF THE DRAWINGS

FIG. 7 includes a diagram of a single-ended receiver circuit according to certain aspects disclosed herein and corresponding timing charts.

DETAILED DESCRIPTION

Various aspects are now described with reference to the drawings. In the following description, for purposes of explanation, numerous specific details are set forth in order to provide a thorough understanding of one or more aspects. It may be evident, however, that such aspect(s) may be practiced without these specific details.

As used in this application, the terms "component," "module," "system" and the like are intended to include a computer-related entity, such as, but not limited to hardware, firmware, a combination of hardware and software, software, or software in execution. For example, a component may be, but is not limited to being, a process running on a processor, a processor, an object, an executable, a thread of execution, a program and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets, such as data from one component interacting with another component in a local system, distributed system, and/or across a network such as the Internet with other systems by way of the signal.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Figure 1:
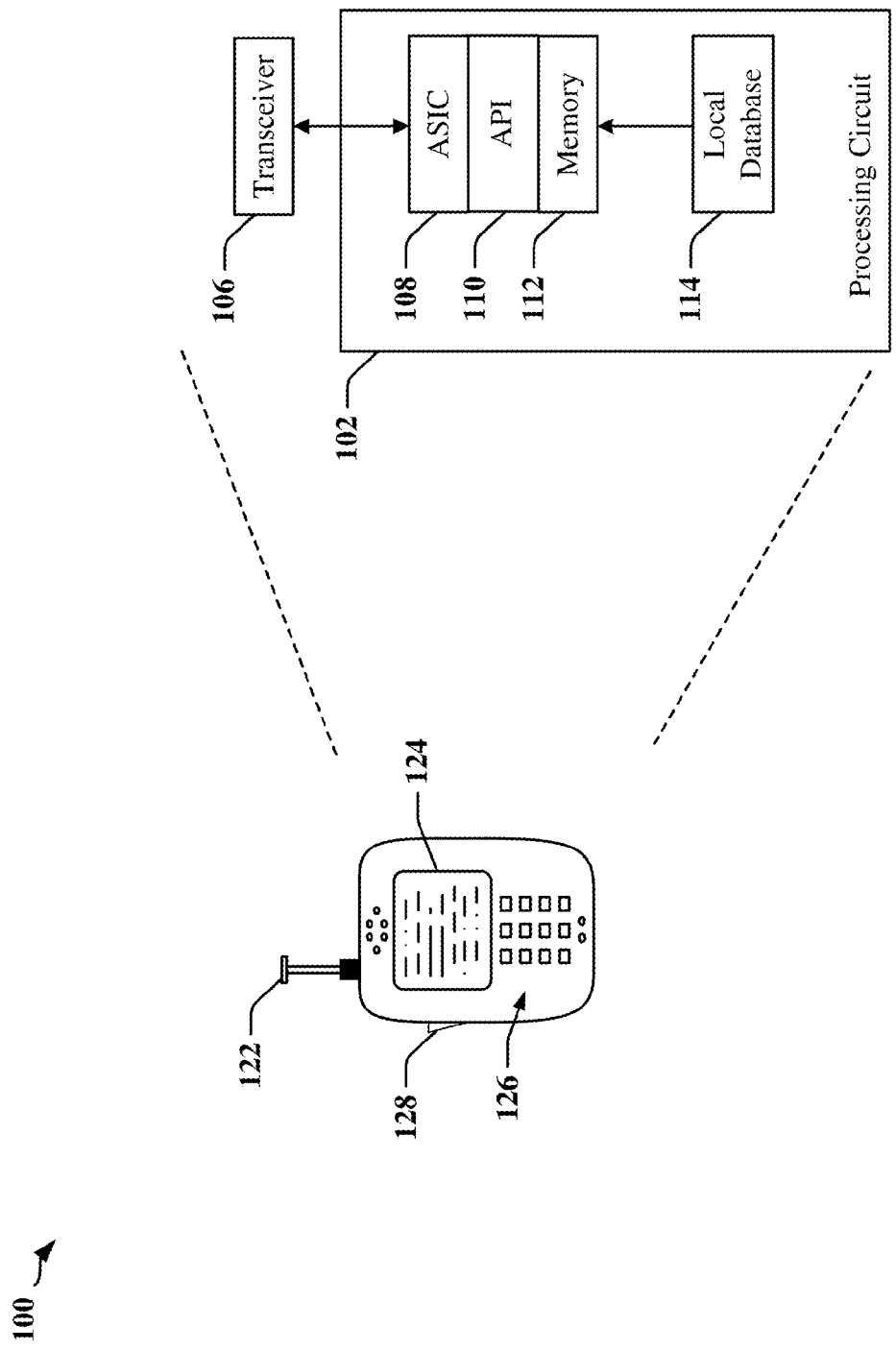
FIG. 1 depicts an apparatus employing a high-speed data link between circuits.

Certain aspects of the invention may be applicable to communication links deployed between electronic devices that may include subcomponents of an apparatus such as a telephone, a mobile computing device, an appliance, automobile electronics, avionics systems, etc. FIG. 1 depicts an apparatus 100 that may employ a communication link between IC devices. In one example, the apparatus 100 may comprise a wireless communication device that communicates through a radio frequency (RF) transceiver with a radio access network (RAN), a core access network, the Internet and/or another network. Apparatus 100 may include a communications transceiver 106 operably coupled to a processing circuit 102. The processing circuit 102 may comprise one or more IC devices, such as an application-specific IC (ASIC) 108. The ASIC 108 may include one or more processing devices, logic circuits, and so on. The processing circuit 102 may include and/or be coupled to processor-readable storage such as a memory device 112 that may maintain instructions and data that may be executed by the processing circuit 102. The processing circuit 102 may be controlled by one or more of an operating system and an application programming interface (API) 110 layer that supports and enables execution of software modules residing in storage media, such as the memory device 112 of the wireless device. The memory device 112 may include read-only memory (ROM) or random-access memory (RAM), electrically erasable programmable ROM (EEPROM), flash cards, or any memory device that can be used in processing systems and computing platforms. The processing circuit 102 may include, or have access to a local database 114 that can maintain operational parameters and other information used to configure and operate the apparatus 100. The local database 114 may be implemented using one or more of a database module, flash memory, magnetic media, EEPROM, optical media, tape, soft or hard disk, or the like. The processing circuit may also be operably coupled to external devices such as an antenna 122, display 124, operator controls, such as a button 128 and a keypad 126 among other components.

Figure 2:
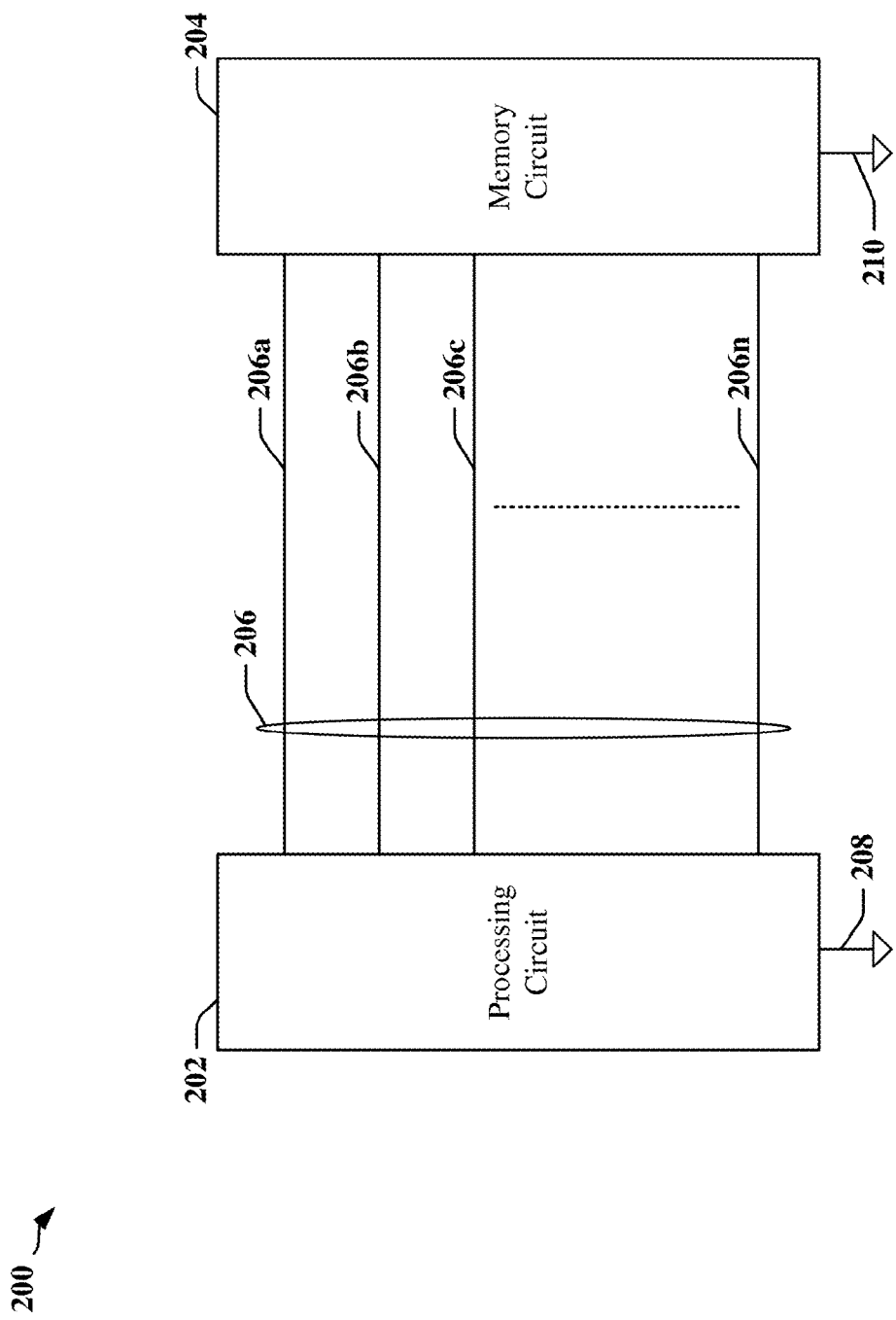
FIG. 2 is a diagram illustrating an apparatus in which a pair of IC devices communicates using a single-ended communication link.

FIG. 2 is a diagram illustrating an apparatus 200 in which a pair of devices 202, 204 communicate using a single-ended communication link 206. The pair of devices or circuits 202, 204 may be components of the apparatus 100 depicted in FIG. 1, for example. The communication link 206 may include a number n connectors 206a-206n constructed from wires, electrically conductive traces on a circuit board or chip carrier, package substrate, silicon (or alternative material) interposer, electrically conductive traces in a metallization layer of an IC, and/or other electrical connectors and devices. The communication link 206 may include unidirectional and/or bidirectional connectors 206a-206n. The communication link 206 may be single-ended, whereby each signal is transmitted on one signal wire 206a-206n. For example, a processing circuit 202 may transmit a data signal on a wire 206a, where the data signal is referenced to a ground or other common reference voltage 208 defined at the processing circuit 202. In the example, the data signal may be received by a memory circuit 204 that captures and decodes data in the data signal by comparing the data signal to a ground or common reference voltage 210 defined at the memory device 204. While the common references 208 and 210 used by the processing circuit 202 and memory circuit 204 may nominally be at the same voltage level, differences may occur due to offsets caused by current flow in interconnects between the common reference inputs 208 and 210 and by variations caused by decoupled noise or offsets affecting the devices 202 and 204 disproportionately.

Figure 3:
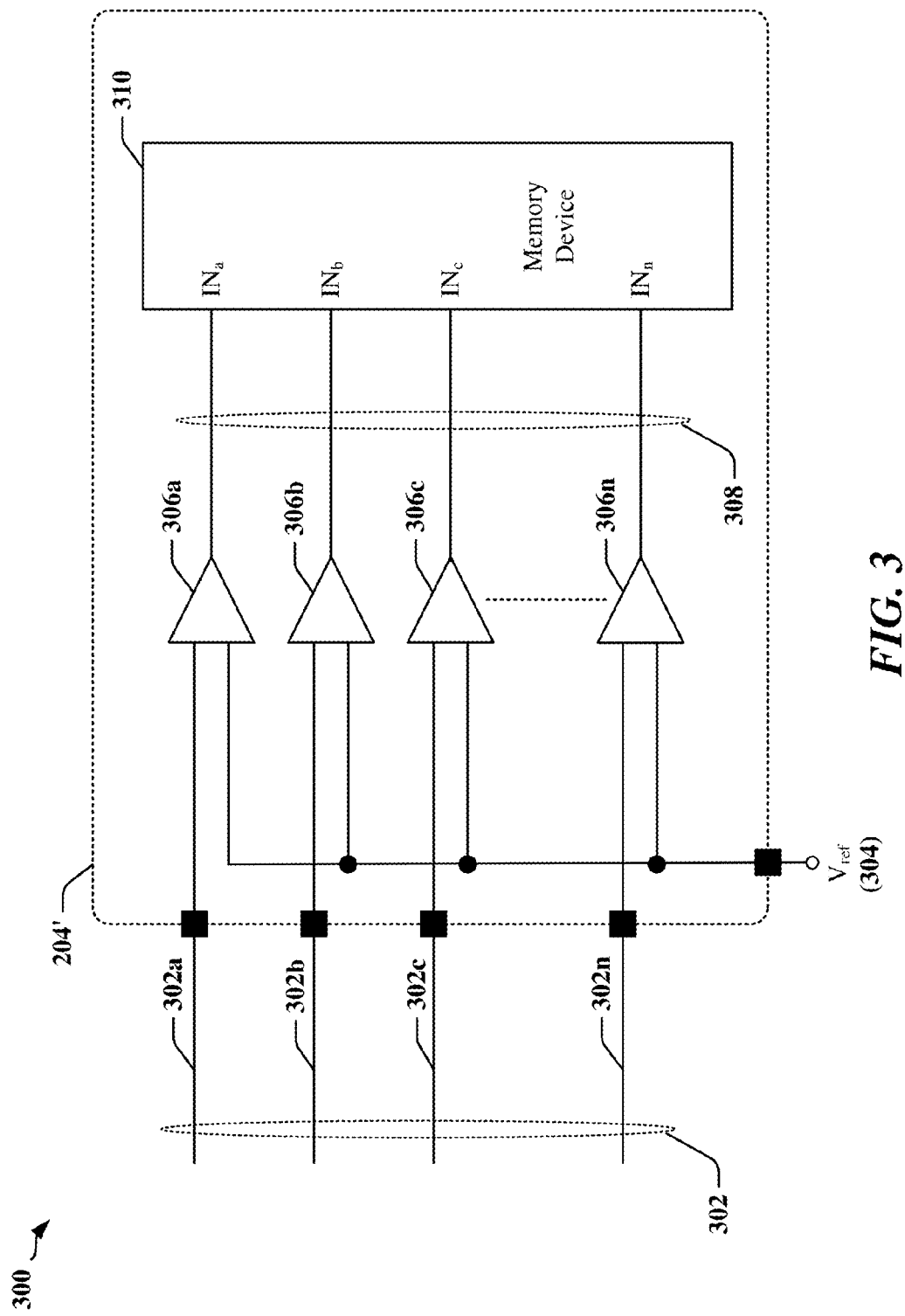
FIG. 3 illustrating certain aspects of a device adapted to receive signals from a single-ended communication link.

FIG. 3 is a diagram 300 illustrating certain aspects of a circuit 204', which may include one or more IC devices that constitute part or all of the memory circuit 204 of FIG. 2. In one example, the circuit 204' may include one or more memory devices 310. The circuit 204' may be adapted to receive a plurality of signals 302a-302n from a communication link 302. In the example, the signals 302a-302n may be transmitted as single-ended signals over the wires or connectors of the communication link 302. The diagram 300 illustrates a configuration of receiver circuitry, although the communication link 302 may be bidirectional and may be driven by the circuit 204' using one or more line driver circuits (not shown), which may be placed in high impedance states when data is being received by the circuit 204' from the communication link 302.

Each of n receivers 306a-306n may be configured to receive a signal 302a-302n from a wire of the communication link 302. Each of the receivers 306a-306n may determine the logic state of a received input signal 302a-302n as the difference between the input signal 302a-302n and a reference voltage 304 defined at the receiving device or circuit 204'. In one example, each input signal 302a-302n may be compared to a reference voltage 304 that has a voltage level that is nominally mid-way between two voltage levels employed by the receiving circuits.

Data carried or encoded in the input signals 302a-302n may be extracted and/or sampled between transitions on the signal wires of the communication link 302. In one example, a trigger signal may be extracted from the communication link 302 to indicate trigger points where the input signals 302a-302n are expected to be stable. The trigger signal may include a sample clock, a sampling edge, a data strobe or another control signal. In one example, the receivers 306a-

306n may provide output signals 308 that can be provided to one or more devices such as a memory device 310. In another example, the output signals 308 may be provided to one or more of a processing circuit 102 (see FIG. 1), a transceiver 106 and/or other devices or circuits. In the depicted example, the output signals 308 drive certain inputs of the memory device 310, and the receivers 306a-306n may be configured to produce output signals 308 that switch between the logic levels used by the memory device 310. In some instances, the output signals 308 may be further conditioned between the receivers 306a-306n and the memory device 310.

Data capture at the receiving device 204' may be degraded by prolonged rise and fall times of the data signals on the signal wires 302a-302n, poor input sensitivity caused by insufficient voltage separation between reference voltage 304 and voltage levels observed on one or more of the signal wires 302a-302n. Data capture at the receiving device 204' may also be degraded by offsets between the reference voltage 304 at the receiver and a reference voltage used by a transmitter. The presence of uncorrelated noise between the receiver reference signal 304 and the input data signals 302a-302n may also affect data capture. Insufficient separation between switching levels of the data signals 302a-302n and the reference voltage 304 may prevent a receiver 306a-306c from resolving a distinct signal level.

Offsets between reference voltages may be caused by the configuration of connected devices with respect to power supplies, circuit design and differences in process technology used to manufacture devices. In one example, transmitter and receiver circuits may define their respective reference voltages with respect to power rails, which may be at different levels, or which can be offset due to resistive coupling in power distribution within an apparatus or device 100, 200. In another example, different reference voltages may result from differences in circuit configuration, whereby a transmitter circuit constructed from N-type metal-oxide-semiconductor (NMOS) transistors transmits a signal to a receiver circuit constructed from P-type metal-oxide-semiconductor (PMOS) transistors, and vice versa. In the latter example, transmitter and receiver references may be derived from different rail voltages that are afflicted by different levels of noise and other fluctuations. In some examples, the transmitting and receiving circuits may be formed using different IC technologies (i.e., distinct silicon dopants, one end constructed from silicon-on-insulator (SOI) or silicon-germanium, etc.). In some examples, the transmitting and receiving circuits may be formed on substrates from distinct integrated circuit technology nodes having different physical geometry limitations and corresponding applied voltage constraints. These constraints may necessitate that a transmitted signal be level-shifted to maintain compatibility with receiving circuits.

Figure 4:
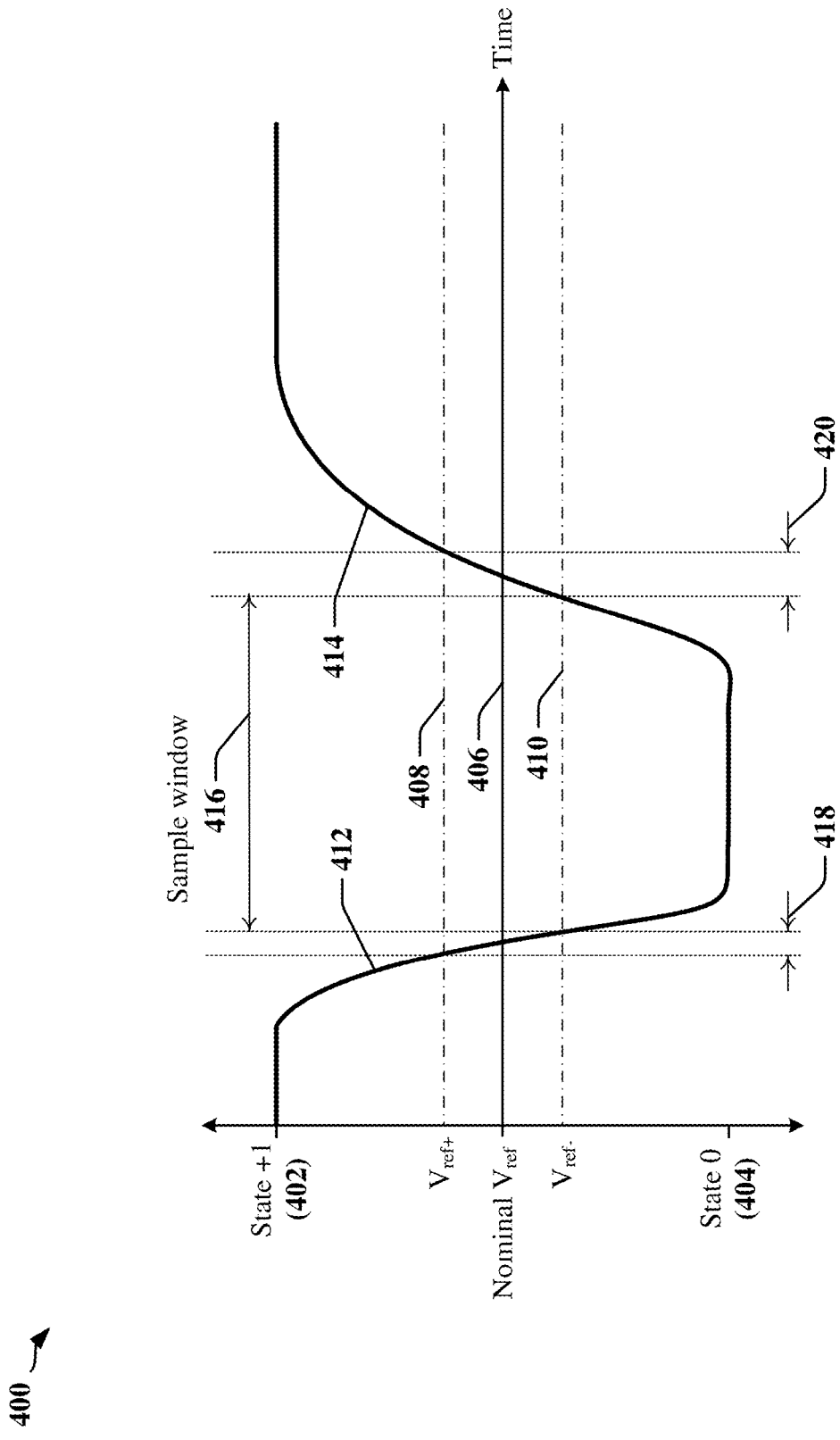
FIG. 4 is a simplified example of signal rise times in a single-ended receiver.

FIG. 4 is a diagram 400 illustrating variability of a sample window 416 available to decode an input signal received from signal wires 302a-302n. The sample window 416 represents the interval of time during data may be reliably captured from one or more signal wires signal wires 302a-302n. The sample window 416 may indicate when the input signals on the one or more signal wires 302a-302n cross a threshold voltage level corresponding to a nominal reference voltage 406.

Variability may be observed in the sample window 416 due to the effects of process, voltage and temperature (PVT) on the nominal reference voltage 406. Accordingly, the reference voltage 406 may vary between a maximum threshold voltage 408 ($V_{ref+}$) and a minimum threshold voltage 410 ($V_{ref-}$). In another example, variability in the sample window 416 may arise from differences between rise times and fall times of transitions 412 and 414 in the input signal received on the signal wires 302a-320n and/or in the output 308 of one or more of the receivers 306a-306n. The variability in signal rise times and in detection circuits may be at least partially attributable to manufacturing process tolerances, variations and stability of voltage and current sources and operating temperature. In some instances, variability in the sample window 416 for one of the input signals 302a-302n may be affected by the timing of the other input signals 302a-302n. Typically, multiple parameters affect the sample window 416, leading to variable time tolerances 418 and 420 that narrow the effective sample window 416.

The sample window 416 may be viewed as the time period when the signal is stable and data can be reliably sampled. The sample window 416 accounts for uncertainty arising from signal rise and fall times, variations in threshold voltage levels (i.e. between $V_{ref+}$ and $V_{ref-}$), and differences between transmitter and receiver operating voltages and conditions. In some instances, sampling is performed within a sampling window 416 that is common to a plurality of signals 302a-302n. For example, in a memory system, each line of address signals and/or data signals is typically sampled within a common sampling window 416.

Noise and offsets on the voltage reference 406, including uncorrelated differences between transmitter and receiver reference voltage levels, may require tuning of the reference voltage 406, its tolerances 408, 410 and/or the operation of the receivers 306a-306n in order to reduce narrowing of the sample window 416 and to maximize switching speeds. Variability in the size of the sample window 416 and jitter may be caused in part by the electrical characteristics of the wires carrying the input signals 302a-302n.

Figure 5:
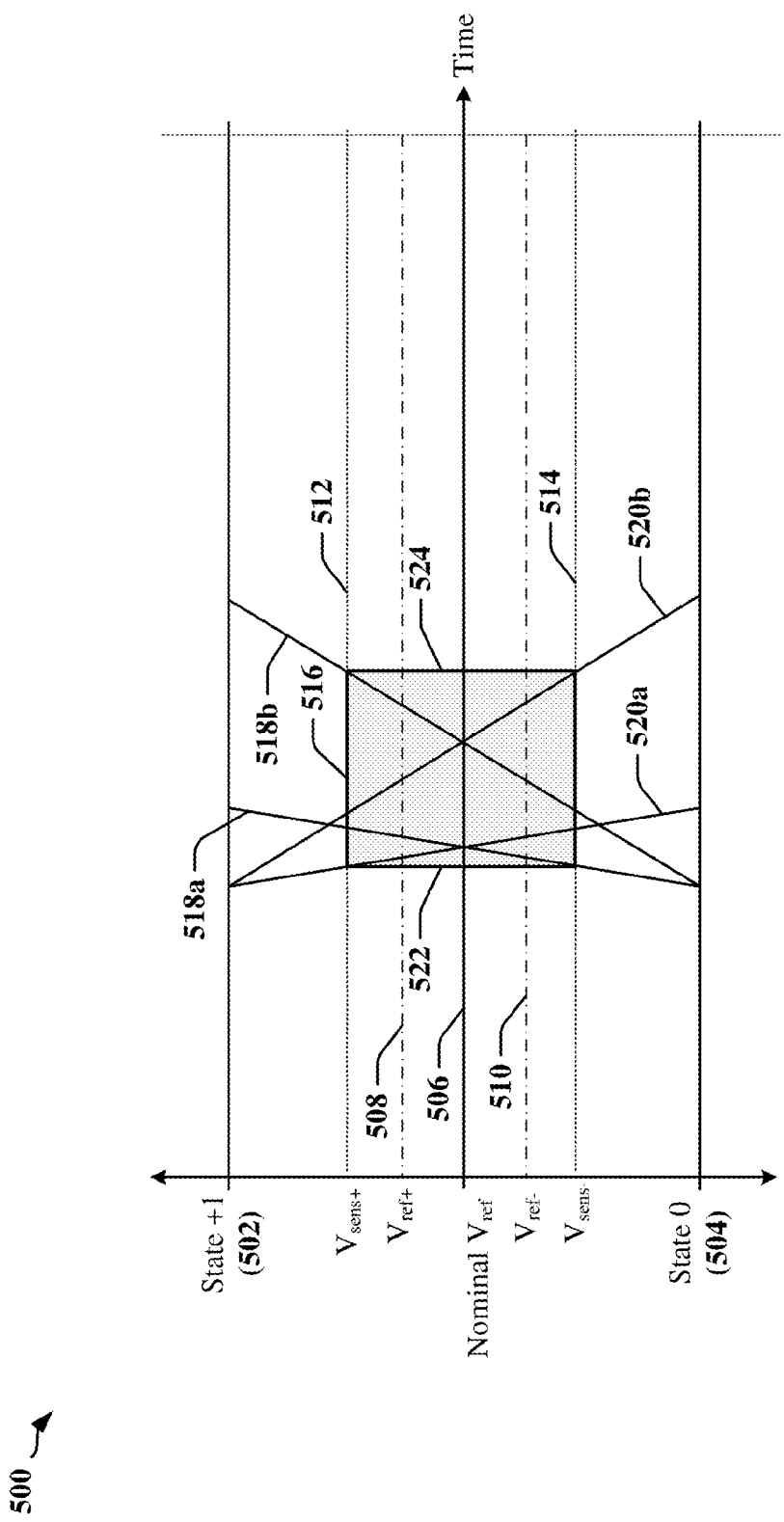
FIG. 5 illustrates the combined effects of variables acting on timing in a single-ended receiver.

FIG. 5 is a timing diagram 500 illustrating the combined effects of circuit variables and operational tolerances on one or more receivers 306a-306n. A box 516 may be used to define an area of switching uncertainty. The box 516 is bound at the upper edge by a threshold voltage ($V_{sens+}$) 512 that represents the minimum voltage of the signal required to guarantee detection of a first state 502 by a receiver 306a-306n. The $V_{sens+}$ threshold voltage 512 includes the maximum reference voltage 508 (i.e. variability above nominal reference voltage 506) and the voltage required to ensure detection by the receiver 306a-306n. The box 516 is bound at the lower edge by a threshold voltage ($V_{sens-}$) 514 that represents the minimum voltage of the signal that guarantees detection of a second state 504 by the one or more receivers 306a-306n. The $V_{sens-}$ threshold voltage 514 includes the minimum reference voltage 510 (i.e. variability below nominal reference voltage 506) and the voltage required to ensure detection by the receiver 306a-306n.

The vertical edges 522, 524 of the box 516 mark the minimum and maximum transition times for the signal. In the example timing diagram 500, falling and rising edges are subject to the same variability, with the fastest transitions 518a and 520a reaching their respective worst-case sensing voltages 514 and 512 (respectively) at the time corresponding to the leftmost vertical edge 522 of the box 516, and the slowest edges 518b and 520b reaching their respective worst-case sensing voltages 514 and 512 at the time corresponding to the rightmost vertical edge 524 of the box 516. In some instances, it can be expected that rising edges and falling edges transition at different rates.

Data capture capabilities may be degraded by poor input sensitivity, which can occur when the receiver requires relatively large separation in voltage between reference voltages and data levels in order to resolve a distinct signal level. Data capture may also be degraded by offsets and noise in reference voltages, where the noise or offset may be uncorrelated between one or more reference voltages and the data signal.

Figure 6:
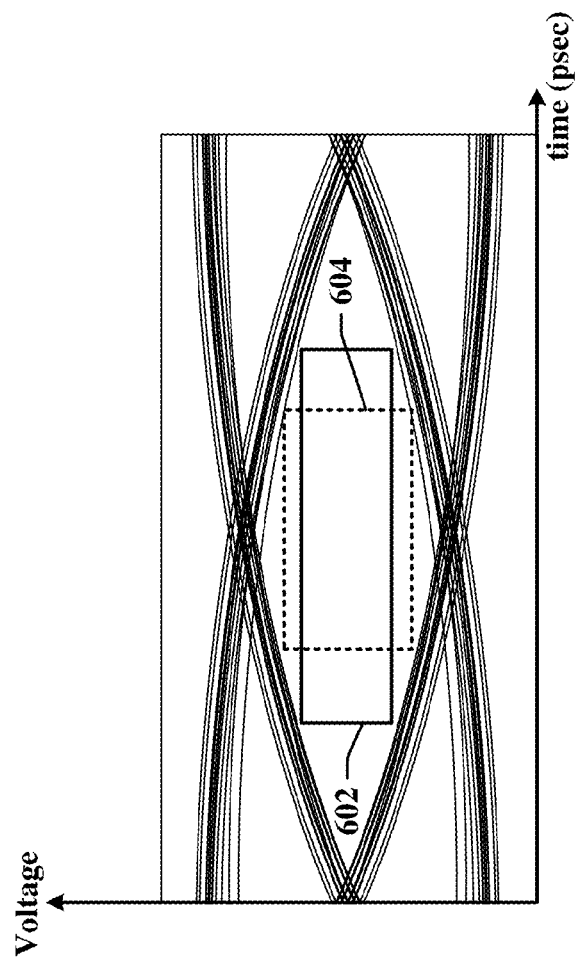
FIG. 6 is an eye pattern illustrating eye regions and data masks.

FIG. 6 is an eye pattern 600 that may be generated as an overlay of multiple cycles of a transient signal waveform with corresponding variable rise and fall times. Signaling state information may be determined reliably in a region defined by a valid data mask 602 or 604 within an "eye opening" that represents the time period in which the symbol is stable and can be reliably received and decoded. One valid data mask 602 represents the area of viability when required voltage separation between threshold and state voltages is minimized and another valid data mask 604 represents an area of viability for examples where greater separation between threshold and state voltages is required. The valid data mask 602 or 604 masks off a region in which zero crossings do not occur, and the eye mask can be used to identify the bounds of a sampling strobe signal. In the example, the taller valid data mask 604 is applicable when the reference voltage is expected to be higher (or lower) than nominal values, and/or when the receiver is afflicted with poor input sensitivity. The narrower width of the taller valid data mask 604 implies lost timing margin with respect to the shorter valid data mask 602.

FIG. 7 includes a drawing 700 illustrating an example in which a receiver circuit 706 can be employed to improve timing margins in a receiver on a single-ended communication link according to certain aspects disclosed herein. The receiver sensitivity of the receiver circuit 706 can be improved and higher transmission rates may be enabled on a communication link by suppressing offsets and certain uncorrelated noise associated with a reference voltage 712 used by a transmitter 702. The receiver circuit 706 may be configured or adapted to optimize voltage levels of signals 710 transmitted to the receiver circuit 706 relative to a reference voltage 724 used by the receiver circuit 706. Higher data rates may be obtained using the receiver circuit 706 without training the receiver reference voltage 724, which may otherwise be needed to accommodate offsets between the receiver reference voltage 724 and the reference voltage 712 used by a transmitter 702.

A signal (Tx Signal) 710 transmitted through a transmission line or channel 704 by the transmitter 702 may be received at an input 716. The transmission line 704 may include one or more of a trace on a printed circuit board, package substrate, silicon (or alternative material) interposer, metallization on an IC, a wire, a cable or other communication link. In some channel topologies, the transmission line 704 may be terminated by an impedance 708, which is typically resistive in nature when included. In some channel topologies, the terminating impedance 708 is not required and/or is not desirable.

The transmission line 704 may be capacitively coupled to the input 716 of the receiver circuit 706. In one example, a capacitor 718 blocks the DC component of the signal received at the input 716, leaving the common-mode level of the input signal undefined. A biasing (e.g. pull-up or pull-down) resistor 728 may align the remaining AC components received at the input 716 with a bias voltage, which may be the DC receiver reference voltage 724. The resulting reference-aligned AC components may be centered on the receiver reference voltage 724 and the receiver circuit 706 can be configured to detect positive and negative voltage deviations at the input 716 in relation to the receiver reference voltage 724. The contribution of differences between the receiver reference voltage 724 and the DC component of the input signal are therefore eliminated or substantially reduced such that these differences may become irrelevant to the operation of the receiver circuit 706.

The receiver circuit 706 may be constructed using any desired semiconductor technology. Receiver transistors 720 and 722 may be implemented as NMOS, PMOS and/or CMOS transistors. The output 714 of the receiver circuit 706 may be configured to switch between the logic levels employed in a host semiconductor device. Simple logic circuits may be configured to produce a non-return to zero (NRZ) version of the output signal 714.

FIG. 7 also includes graphs 730, 740 and 750 that illustrate certain operational aspects of the circuit illustrated in the drawing 700. A first graph 730 illustrates a plot of the Tx Signal 710 that is transmitted by the transmitter 702, and that varies about a DC level 712' that is different from the nominal reference voltage 724' used by the receiver circuit 706. A second graph 740 illustrates the signal at the input 716 of the receiver circuit 706 after the DC component of the Tx Signal 710 has been removed and replaced by the receiver reference voltage 724. As depicted in the graph 740, the signal at the input 716 of the receiver circuit 706 is centered on the reference voltage level 724' and emphasizes edges in the signals. At certain frequencies determined in part by the values of the resistance 728 and capacitance 718 (i.e., the RC time constant), the signal returns to zero between edges.

The third graph 750 illustrates the use of hysteresis threshold voltage levels 752 and 754 that may be used to produce NRZ signals from the edge-emphasized signal illustrated in the second graph 730. According to certain aspects disclosed herein, the output 714 of the receiver circuit 706 may be restored to NRZ signal format using hysteresis comparison techniques that are well known in the art. The hysteresis comparison may be performed by logic operating at the voltage levels of the device hosting the receiver circuit 706. For example, the NRZ signals may be produced using logic circuits switching between logic levels that are compatible with CMOS devices. In one example, hysteresis may be introduced by latching the output signal 714 in a device that uses different threshold voltages 752 and 754 for positive and negative transitions. In one example, conditioning logic 726 may include an output latch (not shown) that may switch in response to positive and negative edges of the signal at input 716 crossing the different threshold voltages 752 and 754. Accordingly, a first output state is set only when the signal transitions above the first threshold voltage level 752 and the second state is set only when the signal transitions below the second threshold voltage level 754, with transitions through the nominal reference voltage 724' having no effect on the output.

According to certain aspects disclosed herein, the receiver circuit 706 can eliminate the need for reference voltage training, although input offset calibration may be performed to improve performance of the receiver circuit 706. The elimination of training circuits can reduce die circuit area and link calibration and/or re-training time. Uncorrelated reference voltage noise may be eliminated and link performance may be optimized as a result. Moreover, the input levels may be optimized around a desired reference voltage level in order to optimize receiver circuit 610 performance.

Figure 8:
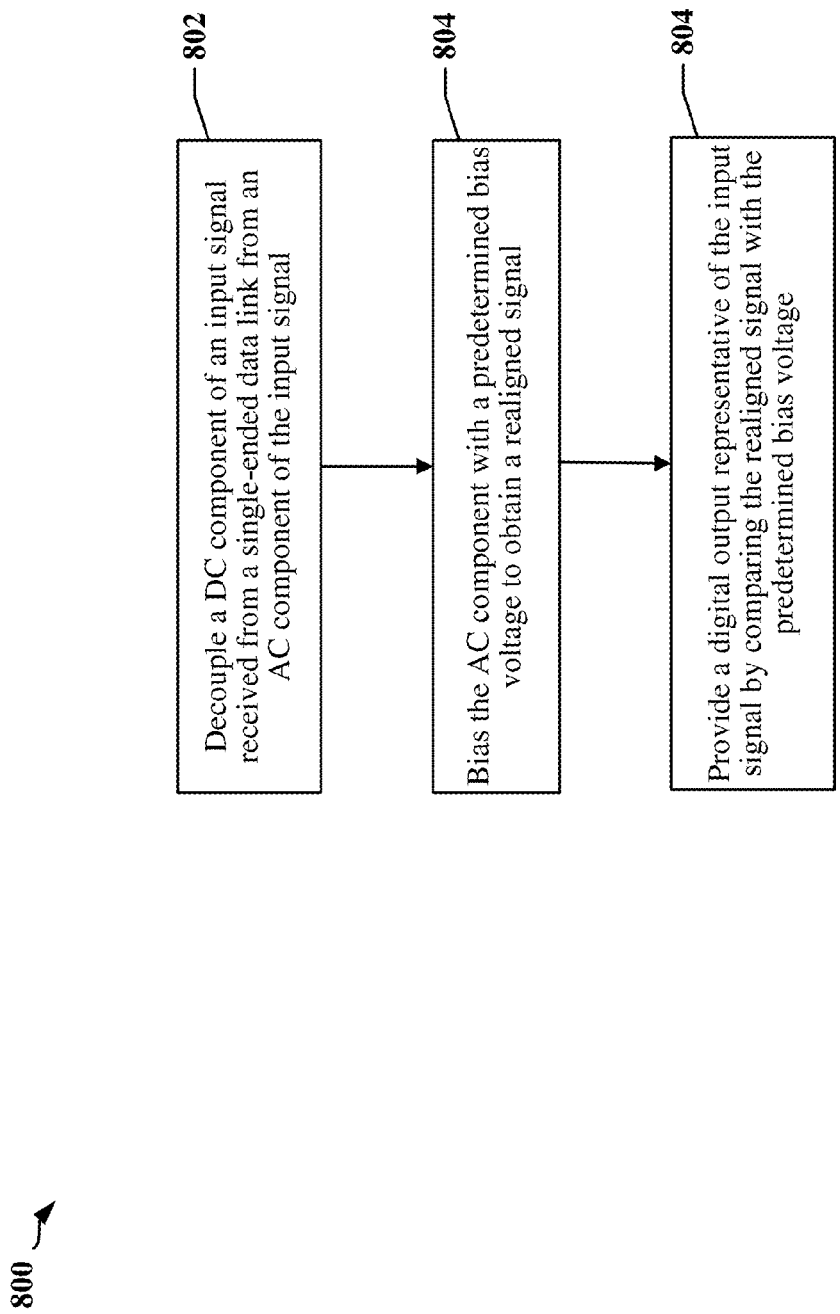
FIG. 8 is a flow chart of a method for receiving single-ended signals using reference-voltage-less pseudo-differential input circuitry.

FIG. 8 is a flowchart 800 illustrating a data communication method according to certain aspects of the invention. The method may be performed by a receiver 706 (see FIG. 7) of a single-ended signal. The receiver 706 may be located in a first IC device. At step 802, the IC device may decouple a DC component from an AC component in an input signal received from a single-ended data link. The input signal may be representative of a signal transmitted over a wire, a connector or other interconnect by a transmitter 702. The transmitter may be located in a second IC device. The DC component may be decoupled from the AC component using a capacitor 718.

At step 804, the IC device may bias the AC component with a bias voltage to obtain a realigned signal. In one example, the bias voltage may be a reference voltage 724 used by a receiver circuit 706 (see FIG. 7). The AC component may be biased by resistively coupling an output of the capacitor 718 to the reference voltage 724. The capacitor 718 may have a capacitance value that is selected to cause the realigned signal to return to a predetermined voltage between transitions. The output of the capacitor 718 may be resistively coupled to the reference voltage 724 using a resistor 722. The resistor 722 may have a resistance value selected to cause the realigned signal to return to a predetermined voltage between transitions. The AC component may emphasize transitions in the input signal. The AC component may be biased by centering the AC component on a voltage coincident with the optimal input common-mode level of the receiving circuit 706.

At step 806, the IC device may provide a digital output representative of the input signal by comparing the realigned signal with the bias voltage. The bias voltage may be a reference voltage 724 generated by the receiver 706. The digital output may switch between desired or specified logic states. The realigned signal may be compared with the bias voltage using hysteresis comparison that switches the digital output between logic states compatible with a logic circuit that receives and/or responds to the digital output. The logic states may be compatible with logic levels associated with CMOS, NMOS, PMOS, and/or other digital technologies.

In an aspect of the disclosure, the single-ended data link includes a transmission line 704. The transmission line 704 may include one or more of a trace on a printed circuit board, package substrate, silicon (or alternative material) interposer, metallization on an integrated circuit, and a wire.

Figure 9:
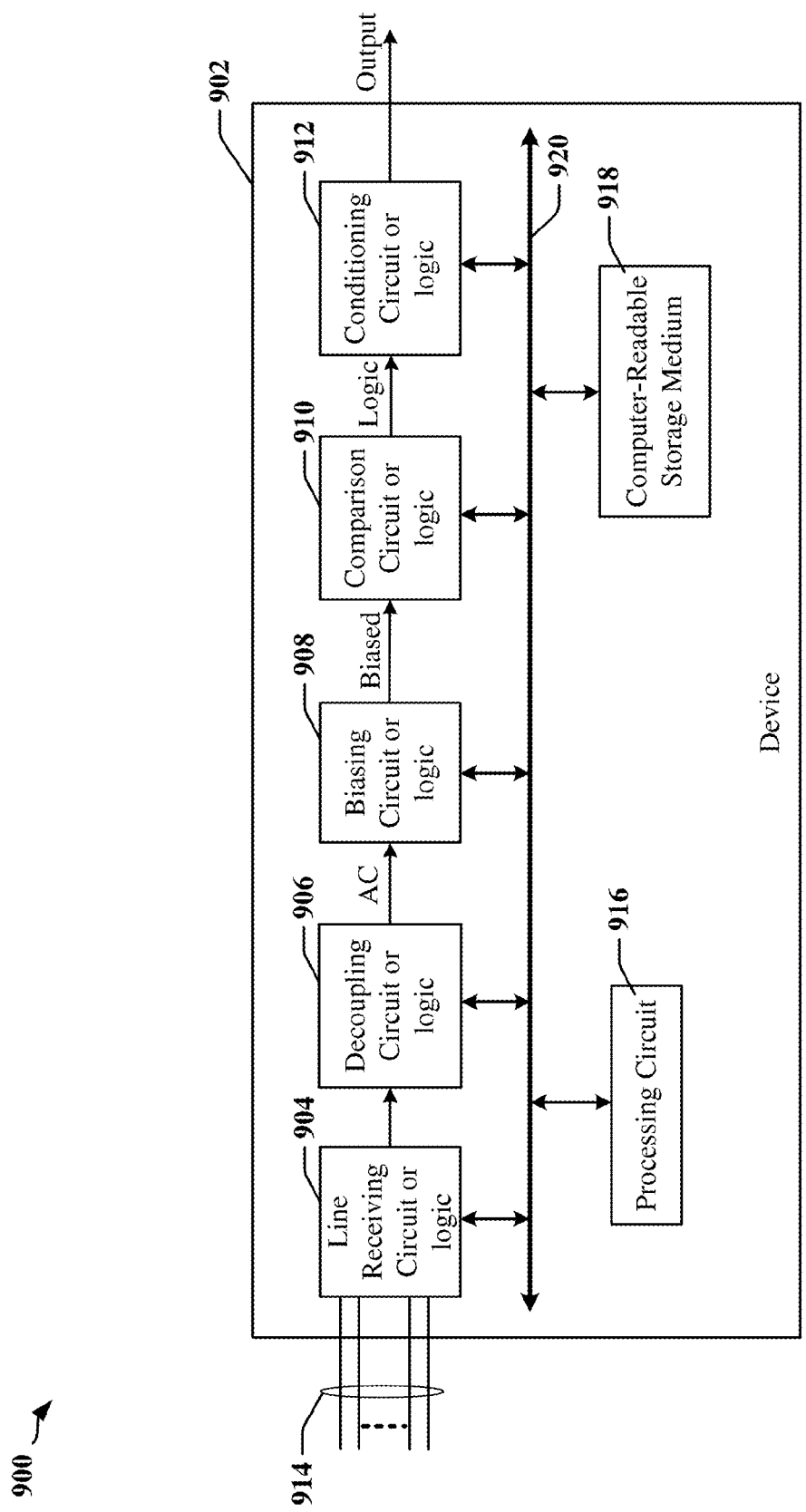
FIG. 9 is a diagram illustrating an example of a hardware implementation for an apparatus having a receiver that employs reference-voltage-less pseudo-differential input circuitry according to one or more aspects disclosed herein.

FIG. 9 is a diagram 900 illustrating a simplified example of a hardware implementation for a device 902 employing certain aspects of the communications methods disclosed herein. The device 902 may be an IC device and may include a processing circuit 916 that may include one or more of a microprocessor, microcontroller, digital signal processor, a sequencer and a state machine. The processing circuit 916 may be implemented with a bus architecture, represented generally by the bus 920. The bus 920 may include any number of interconnecting buses and bridges depending on the specific application of the processing circuit 902 and the overall design constraints. The bus 920 links together various circuits including one or more processors and/or hardware modules, represented by the processing circuit 916, the modules or circuits 904, 906, 908, 910 and 912 and the bus may enable configuration and/or reconfiguration of one or more of the modules or circuits 904, 906, 908, 910 and 912. The bus 920 may also link various other circuits such as timing sources, peripherals, voltage regulators, and power management circuits, which are well known in the art, and therefore, will not be described any further. The device 902 may communicate over connectors or wires 914.

The processor 916 is responsible for general processing, including the execution of software stored on the computer-readable storage medium 918. The software, when executed by the processor 916, causes the processing circuit 916 to perform or configure various functions described supra for any particular apparatus. The computer-readable storage medium 918 may also be used for storing data that is manipulated by the processing circuit 916 when executing software, including data decoded from signals transmitted over the connectors 914. The device 902 further includes at least one of the modules 904, 906, 908, 910 and 912. The modules 904, 906 and 908 may include some combination of software modules running in the processing circuit 916, and hardware circuits or modules.

In one configuration, the device 902 may be configured for communications over a single-ended transmission line, including the wires 914. The device may include a module and/or circuit 904 that is configured to receive an input signal from the single ended transmission line 914, a module and/or circuit 906 for decoupling a DC component of the input signal from an AC component of the input signal, a module and/or circuit 908 for biasing the AC component with a predetermined bias voltage to obtain a realigned signal, and a module and/or circuit 910 for providing a digital output representative of the input signal. The module and/or circuit 910 may include or cooperate with a conditioning circuit or logic 912 (see also conditioner 726 of FIG. 7) to provide a digital output compatible with a logic circuit that is responsive to information in the input signal. The conditioning circuit or logic 912 may include comparison logic, squaring logic (e.g. using hysteresis comparison), level switching and other conditioning logic and circuits.

The aforementioned means may be implemented, for example, using some combination of elements of the receiver circuit 706 and coupling capacitor 718, which may be incorporated in the receiving circuit 706.

It is understood that the specific order or hierarchy of steps in the processes disclosed is an illustration of exemplary approaches. Based upon design preferences, it is understood that the specific order or hierarchy of steps in the processes may be rearranged. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A method for data communications performed at a receiving device, comprising:
   receiving an input signal from a transmitting device through a data link that couples the transmitting device to the receiving device;
   decoupling a direct current (DC) component of the input signal from an alternating current (AC) component of the input signal;
   biasing the AC component with a predetermined bias voltage to obtain a realigned signal; and providing a digital output representative of the input signal by comparing the realigned signal with the predetermined bias voltage.

2. The method of claim 1, wherein the digital output switches between logic states that are compatible with complementary metal-oxide-semiconductor (CMOS) logic levels.

3. The method of claim 1, wherein the realigned signal is compared with the predetermined bias voltage using hysteresis comparison that switches the digital output between logic states compatible with a logic circuit that receives the digital output.

4. The method of claim 3, wherein the logic states are compatible with CMOS logic levels.

5. The method of claim 1, wherein the DC component is decoupled from the AC component using a capacitor.

6. The method of claim 5, wherein biasing the AC component includes resistively coupling an output of the capacitor to the predetermined bias voltage.

7. The method of claim 6, wherein the capacitor has a capacitance selected to cause the realigned signal to return to a desired voltage level between transitions.

8. The method of claim 6, wherein the output of the capacitor is resistively coupled to the predetermined bias voltage using a resistor having a value selected to cause the realigned signal to return to a desired voltage level between transitions.

9. The method of claim 5, wherein transitions in the input signal are emphasized in the AC component.

10. The method of claim 9, wherein biasing the AC component includes centering the AC component on the predetermined bias voltage.

11. The method of claim 1, wherein the data link comprises a transmission line provided between a transmitting integrated circuit device and a receiving integrated circuit device.

12. The method of claim 11, wherein the transmission line comprises one or more of a trace on a printed circuit board, package substrate, interposer, metallization on an integrated circuit, and a wire.

13. An apparatus, comprising:
means for decoupling a direct current (DC) component of an input signal received from data link from an alternating current (AC) component of the input signal;
means for biasing the AC component with a predetermined bias voltage to obtain a realigned signal; and
means for providing a digital output representative of the input signal, wherein the means for providing a digital output is configured to generate the digital output by comparing the realigned signal with the predetermined bias voltage.

14. The apparatus of claim 13, wherein the digital output switches between logic states that are compatible with complementary metal-oxide-semiconductor (CMOS) logic levels.

15. The apparatus of claim 13, wherein the means for providing a digital output is configured to generate the digital output by hysteresis comparison that switches the digital output between logic states compatible with a logic circuit that receives the digital output.

16. The apparatus of claim 15, wherein the logic states are compatible with CMOS logic levels.

17. The apparatus of claim 13, wherein the DC component is decoupled from the AC component using a capacitor.

18. The apparatus of claim 17, wherein the means for biasing the AC component second is configured to resistively couple an output of the capacitor to the predetermined bias voltage.

19. The apparatus of claim 18, wherein the capacitor has a capacitance selected to cause the realigned signal to return to a desired voltage level between transitions.

20. The apparatus of claim 18, wherein the output of the capacitor is resistively coupled to the predetermined bias voltage using a resistor having a value selected to cause the realigned signal to return to a desired voltage level between transitions.

21. The apparatus of claim 17, wherein transitions in the input signal are emphasized in the AC component.

22. The apparatus of claim 21, wherein the means for biasing the AC component second is configured to center the AC component on the predetermined bias voltage.

23. The apparatus of claim 13, wherein the data link comprises a transmission line provided between a transmitting integrated circuit device and a receiving integrated circuit device.

24. The apparatus of claim 23, wherein the transmission line comprises one or more of a trace on a printed circuit board, package substrate, interposer, metallization on an integrated circuit, and a wire.

25. A digital device comprising:
a receiving integrated circuit adapted to be coupled to a transmission line, and to receive a signal from a transmitting integrated circuit through the transmission line;
a decoupling circuit that is configured to decouple a direct current (DC) component from an alternating current (AC) component in the signal that is received from the transmission line;
a biasing circuit adapted to bias the AC component with a predetermined bias voltage to obtain a realigned signal; and
comparison logic configured to generate a digital output representative of the signal that is received from the transmission line by comparing the realigned signal with the predetermined bias voltage.

26. The digital device of claim 25, wherein the comparison logic operates at logic states that are compatible with complementary metal oxide semiconductor (CMOS) logic levels.

27. The digital device of claim 25, wherein the comparison logic includes hysteresis comparison logic that provides a non-return-to-zero (NRZ) digital output.

28. The digital device of claim 27, wherein logic states of the NRZ digital output are compatible with CMOS logic levels.

29. The digital device of claim 25, wherein the DC component is decoupled from the AC component using a capacitor.

30. The digital device of claim 29, wherein the biasing circuit couples an output of the capacitor to the predetermined bias voltage.

31. The digital device of claim 30, wherein the capacitor has a capacitance selected to cause the realigned signal to return to a desired voltage level between transitions.

32. The digital device of claim 30, wherein the output of the capacitor is resistively coupled to the predetermined bias voltage using a resistor having a value selected to cause the realigned signal to return to a desired voltage level between transitions.

33. The digital device of claim 30, wherein transitions in the signal that is received from the transmission line are emphasized in the AC component.

34. The digital device of claim 33, wherein the biasing circuit centers the AC component on the predetermined bias voltage.

35. The digital device of claim 25, wherein the transmission line comprises one or more of a trace on a printed circuit board, package substrate, interposer, metallization on an integrated circuit, and a wire.

* * * * *